United States Patent [19]

Aoki et al.

[11] Patent Number: 4,776,673

[45] Date of Patent: Oct. 11, 1988

[54] LIQUID-CRYSTAL DISPLAY DEVICE

[75] Inventors: Shigeo Aoki, Habikino; Yasuhiro Ukai, Yao; Yasuhiro Matsushita, Kobe, all of Japan

[73] Assignee: Hosiden Electronics Co., Ltd., Osaka, Japan

[21] Appl. No.: 911,694

[22] Filed: Sep. 26, 1986

[30] Foreign Application Priority Data

Oct. 4, 1985 [JP] Japan .................. 60-221664

[51] Int. Cl.$^4$ .......................... G02F 1/13; H01L 29/78
[52] U.S. Cl. .................... 350/334; 350/339 F; 357/4; 357/23.7
[58] Field of Search .............. 350/334, 336, 339 F; 340/784; 357/4, 23.7

[56] References Cited

U.S. PATENT DOCUMENTS

| | | | |
|---|---|---|---|
| 4,021,798 | 5/1977 | Kojima et al. | 350/339 R |
| 4,174,217 | 11/1979 | Flatley | 96/36.2 |
| 4,385,292 | 5/1983 | Nonomura et al. | 350/334 |
| 4,459,739 | 7/1984 | Shepherd et al. | 357/4 |
| 4,523,811 | 6/1985 | Ota | 350/339 R |
| 4,600,274 | 7/1986 | Morozumi | 350/339 R |
| 4,633,284 | 12/1986 | Hansell et al. | 357/4 |
| 4,644,338 | 2/1987 | Aoki et al. | 350/334 |
| 4,687,298 | 8/1987 | Aoki et al. | 357/23.7 |

FOREIGN PATENT DOCUMENTS

| | | |
|---|---|---|
| 0125666 | 11/1984 | European Pat. Off. . |
| 3201122 | 10/1982 | Fed. Rep. of Germany . |
| 3325134 | 1/1984 | Fed. Rep. of Germany . |
| 0056466 | 4/1983 | Japan ............... 357/4 |
| 0189676 | 10/1984 | Japan ............... 357/23.7 |

OTHER PUBLICATIONS

"A Large-Area High-Resolution Active-Matrix Color LCD, etc." by Sunata et al., IEEE Transactions on Electron Devices, vol. ED-33, No. 8, Aug. 1986, pp. 1212-1217.

Primary Examiner—Stanley D. Miller
Assistant Examiner—Tai V. Duong
Attorney, Agent, or Firm—Pollock, VandeSande and Priddy

[57] ABSTRACT

A liquid-crystal cell is formed with first and second transparent substrates opposing each other and a liquid crystal sealed therebetween. A plurality of display electrodes are formed in a matrix arrangement with rows and columns on the inner surface of said first transparent substrate. Gate bus lines are formed on the first transparent substrate along the respective rows of display electrodes. Source bus lines are formed on the first transparent substrate along the respective columns of display electrodes. Thin-film transistors are formed on the first transparent substrate at the intersections of the gate and source bus lines. The thin-film transistors each have a gate electrode connected to the associated gate bus line, a source electrode connected to the associated source bus line and the drain electrode connected to a corresponding display electrode. A common electrode is formed on the second transparent substrate such that it faces the display electrodes. The opposed sides of the source and drain electrodes of each thin-film transistor are constituted by tapered surfaces with the distance therebetween being progressively decreased as they approach the first transparent substrate. Ohmic contact layers are formed on these tapered surfaces. A semiconductor of each thin-film transistor is formed over the source and drain electrodes via the ohmic contact layers.

11 Claims, 6 Drawing Sheets

LIQUID-CRYSTAL DISPLAY DEVICE

BACKGROUND OF THE INVENTION

This invention relates to a liquid-crystal display device and, more particularly, to an active liquid-crystal display device having a large display area and capable of display with a high resolution.

Figure 1:
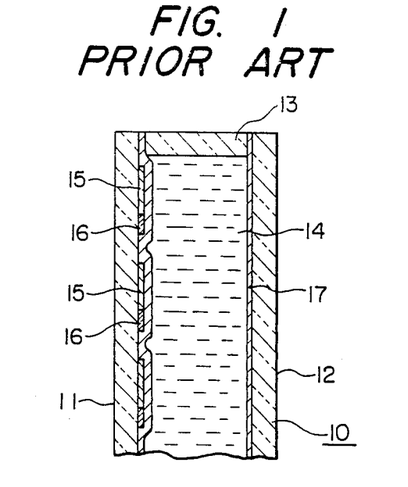
FIG. 1 is a fragmentary sectional view showing the general construction of prior art liquid-crystal display device.

FIG. 1 shows a prior art liquid-crystal display device. The device comprises opposed transparent substrates 11 and 12 of glass or the like which are spaced apart by a spacer 13 provided along their edges and constitute a liquid-crystal cell 10 with a liquid crystal 14 sealed between them. A plurality of display electrodes 15 are formed on the inner surface of the substrate 11. Also, a thin film transistor 16 is each formed as a switching element adjacent to each display electrode 15 with the drain connected thereto. A transparent common electrode 17 is formed on the inner surface of the other substrate 12 such that it opposes the display electrodes 15.

Figure 2:
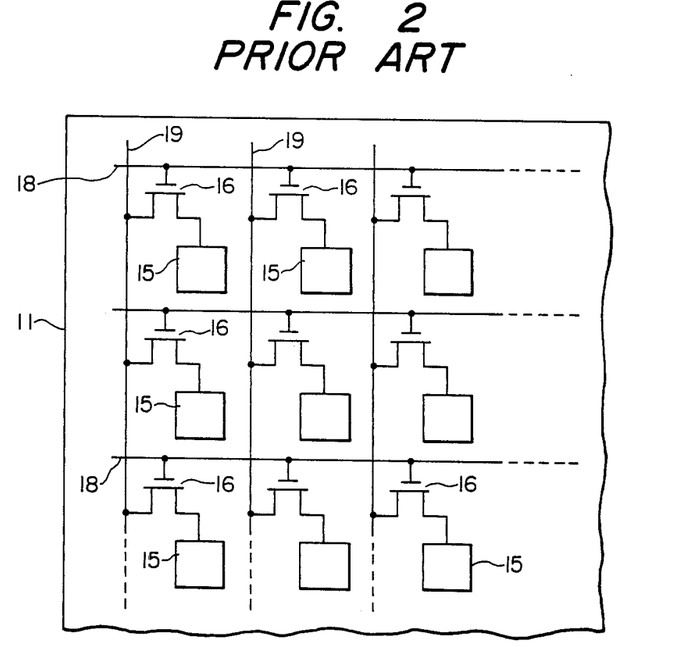
FIG. 2 is a circuit diagram showing the connection of display electrodes, gate buses and source buses of the prior art liquid-crystal display device.

Each of the display electrodes 15 constitutes a picture element, that is, a pixel, for instance. As shown in FIG. 2, the display electrodes 15 are square in shape and are arrayed in a matrix on the transparent substrate 11. Gate bus lines 18 are each formed in the vicinity of and along each row of display electrodes 15 in the matrix. Source bus lines 19 are each formed in the vicinity of and along each column of display electrodes 15 in the matrix. Thin-film transistors 16 are formed at the intersections of the gate and source bus lines 18 and 19. Each thin-film transistor 16 has its gate connected to the associated gate bus line 18, its source connected to the associated source bus line 19, and its drain connected to the corresponding display electrode 15.

When a voltage is applied between a selected one of the gate bus lines 18 and a selected one of the source bus lines 19, the corresponding thin-film transistor 16 is turned on, whereby the corresponding display electrode 15 is charged through the thin film-transistor 16. As a result a voltage is applied across only a portion of the liquid crystal 14 that is found between the corresponding display electrode 15 noted above and common electrode 17, whereby only an area of that display electrode 15 is rendered transparent or light-blocking. In this way, a selective display of display electrodes 15 is obtained. The display can be erased by causing discharge of the display electrode 15.

Figure 3:
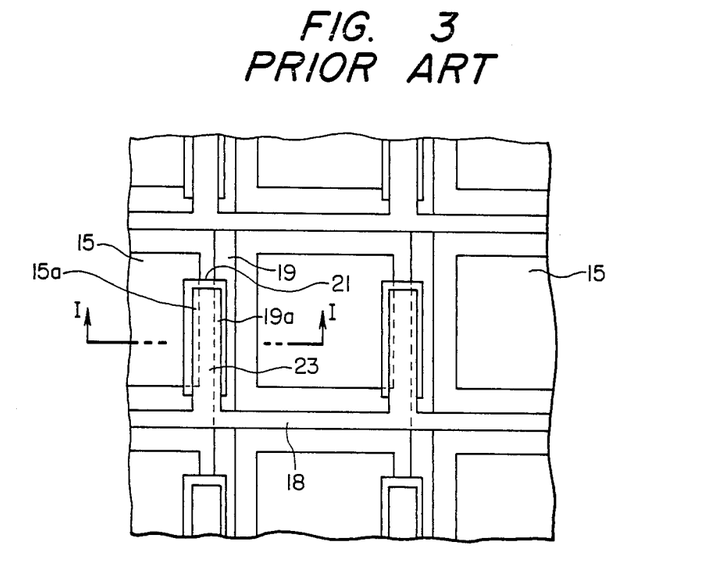
FIG. 3 is a plan view of the substrate 11 shown in FIG. 1.
Figure 4:
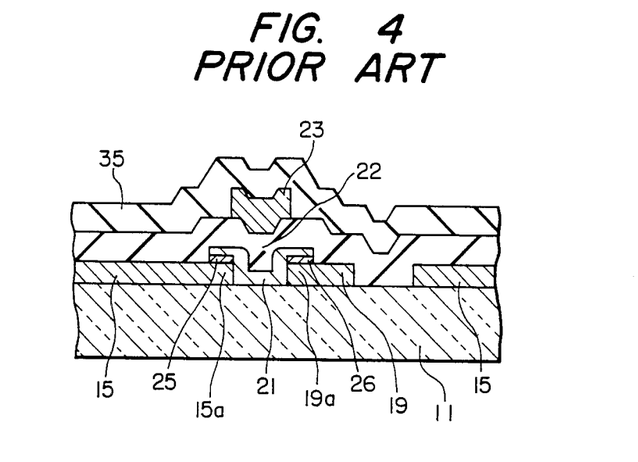
FIG. 4 is an enlarged-scale sectional view taken along line I—I in FIG. 3 showing a prior art thin-film transistor.

In the prior art, the thin film transistor 16 is constructed as shown in FIGS. 3 and 4. As is shown, display electrodes 15 and source bus lines 19 of a transparent conductive film of ITO or the like are formed on the transparent substrate 11. An amorphous-silicon (a-silicon) or like semiconductor layer 21 is formed such that it strides the gap between opposite edges of the display electrode 15 and an associated source bus line 19. A gate insulating film 22 of silicon nitride or the like is formed on the semiconductor layer 21. A gate electrode 23 is formed on the gate insulating film 22 above the semiconductor layer 21 such that the gate electrode 23 partly overlies the display electrode 15 and source bus line 19. The gate electrode 23 has one end connected to the gate bus line 18. Portions of the display electrode 15 and source bus line 19 facing the gate electrode 23 constitute drain and source electrodes 15a and 19a, respectively. The thin-film transistor 16 is constituted by the drain and source electrodes 15a and 19a, semiconductor layer 21, gate insulating film 22 and gate electrode 23.

The gate electrodes 23 and gate bus lines 18 are formed simultaneously from aluminum, for instance. Ohmic contact layers 25 and 26 of n+ type semiconductor, for instance, are formed between the semiconductor layer 21 and the respective electrodes 15a and 19a to reduce adverse effects on the operation characteristics of the thin film transistor 16.

If a liquid-display device of the type described above is to have a large display area and a high resolution of display, a large number of display electrodes 15 should be formed at a high density. Also, the source bus lines 19 should be of a considerable length. This means that because of a voltage drop the potential at a point on each source bus line 19 becomes lower as the point departs from one end of the source bus line connected to the voltage supply. In other words, a brightness gradient is produced on the display such that the brightness of a pixel becomes lower as the pixel is located farther away from the end connected to the voltage supply terminal.

In another aspect, the amorphous silicon constituting the semiconductor layer 22 has photo-conductivity. Therefore, when the semiconductor layer 22 is illuminated by external light, the thin-film transistor can not provide a sufficiently high "off" resistance (i.e., resistance between the source and drain) even when the transistor is in an off state. Further, to form the electrodes and bus lines at high densities, the etching for the formation of the pattern of electrodes 15 and source bus lines 19 is usually effected by an anisotropic dry etching process in a direction perpendicular to the plane of the substrate 11. Therefore, if the thickness of the source bus lines 19 is increased to reduce the resistance thereof, a continuous semiconductor layer could not be formed at the edges of the drain and source electrodes 15a, 19a; in other words, a channel portion of the semiconductor layer 21 between the drain and source electrodes would be separated from the semiconductor layer portions riding on the drain and the source electrodes 15a, 19a. This means that the thickness of the semiconductor layer 22 can not be greatly reduced, and at least a thickness of about 1,000 angstroms is necessary.

Further, the ohmic contact layers 25 and 26, which are formed on the side of the electrodes 15a and 19a opposite the substrate 11, has. Therefore, it is difficult to obtain satisfactory ohmic contact of the electrodes 15a and 19a with the semiconductor layer 22. For this reason, an off-set is produced in the drain current versus drain voltage characteristic.

Further, if the electrostatic capacitance between the source or gate bus line 19 or 18 and common electrode 17 is large, it is difficult to obtain a high speed operation. Besides, since the portion of liquid crystal between the source or gate bus line 19 or 18 and common electrode 17, which portion is not desired to contribute to any display, is also applied with a DC voltage, the possibility of deterioration of the liquid crystal would increase as the area of this liquid crystal portion increases.

SUMMARY OF THE INVENTION

An object of the invention is to provide a liquid-crystal display device which has thin-film transistors having satisfactory ohmic contact between source and drain electrodes and semiconductor layer.

Another object of the invention is to provide a liquid-crystal display device which is free from brightness gradient.

A further object of the invention is to provide a liquid-crystal display device which has thin-film transistors with a high "on"/"off" ratio.

A further object of the invention is to provide a liquid-crystal display device in which the electrostatic capacitance between the source and gate bus lines and common electrode is small, the operation can be performed at a high speed, and less deterioration of the liquid crystal is liable to occur.

DETAILED DESCRIPTION OF THE PREFERRED EMBODIMENTS

Figure 5:
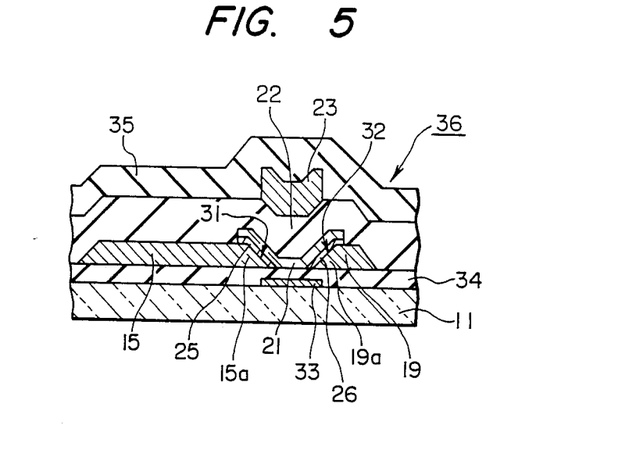
FIG. 5 is a sectional view showing a thin-film transistor in a liquid-crystal display device according to the invention.

FIG. 5 shows a thin-film transistor which constitutes an essential element of the invention. In the Figure, parts like those in FIG. 4 are designated by like reference numerals, and their detailed description is omitted. According to the invention, opposed sides of drain and source electrodes 15a and 19a have tapered surfaces 31 and 32. Ohmic contact layers 25 and 26 consisting of n+ type silicon layers are formed on the entire tapered surfaces 31 and 32. A semiconductor layer 21 is formed to extend over these ohmic contact layers 25 and 26. The tapered surfaces 31 and 32 are formed not by anisotropic etching but by isotropic etching of a transparent conductive layer of, for example, ITO (i.e. Indium Tin Oxide) into a predetermined pattern of display electrodes 15 and source bus lines 19. In the isotropic etching, the transparent conductive layer is etched not only in a direction perpendicular to the plane of the substrate 11 but also in a direction parallel to the plane. The etching is effected substantially at the same rate in both the perpendicular and parallel directions. The tapered surfaces 31 and 32 thus have an inclination angle of about 45° with respect to the substrate 11.

In this example, a light-blocking layer 33 is formed on the substrate 11 such that it faces the semiconductor layer 22. Together with the light-blocking layer 33 a protective layer 34 is formed. The light-blocking layer 33 is made of chromium, for instance. The protective layer 34 is made of silicon dioxide, for instance, and has a thickness sufficient to insulate the light-blocking layer 33 from the electrodes 15a and 19a. Further, a protective layer 35 of silicon nitride, for instance, is formed over the entire surface inclusive of the gate insulating film 22 and gate electrode 24.

Figure 6:
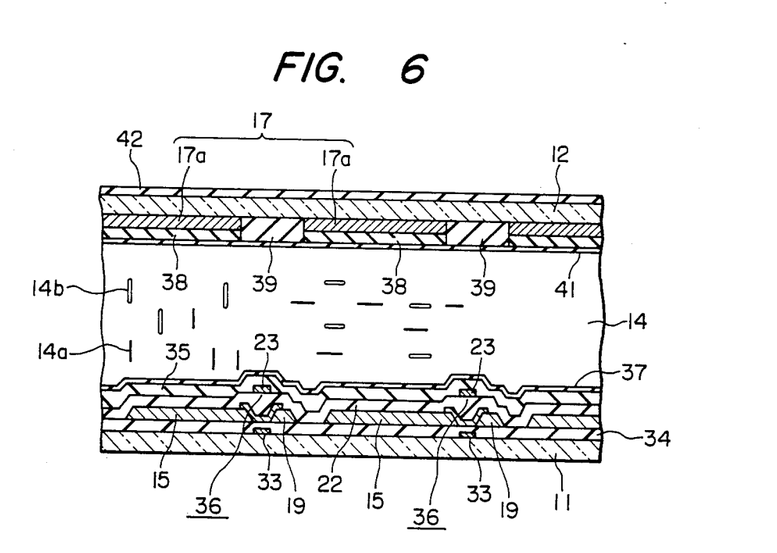
FIG. 6 is a sectional view showing an embodiment of the invention applied to a liquid-crystal display device using a guest-host type liquid crystal.

A liquid-crystal display device according to the invention incorporates therein thin-film transistors having the above explained construction. FIG. 6 shows such a liquid-crystal display device. In the Figure, parts like those in FIG. 1 are designated by like reference numerals. A liquid crystal 14 is sealed between substrates 11 and 12. Display electrodes 15, gate bus lines 18 (not shown) and source bus lines 19 are formed in the manner explained before, and thin-film transistors 36 of a structure shown in FIG. 5 are formed in lieu of the thin-film transistors 16 shown in FIG. 1. In this example, an orientation layer 37 is formed on the protective layer 35 such that it is in contact with the liquid crystal 14. The relationships among the display electrodes 15, source and gate bus lines 19 and 18 and thin-film transistors 36 are the same as described above in connection with the prior art example.

Figure 7:
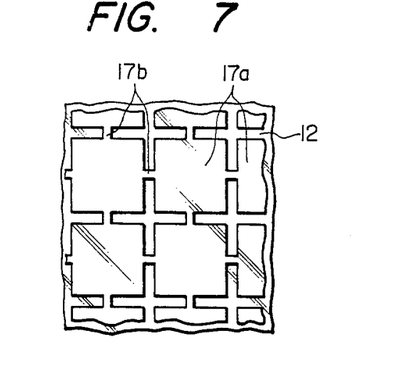
FIG. 7 is a plan view showing a common electrode in the device shown in FIG. 6.

On the side of the transparent substrate 12, a common electrode 17 is formed. The common electrode 17 is shown in FIG. 7. As is shown, it consists of common electrode sections 17a, which have substantially the same size and shape as the display electrodes 15 and are arranged such that they face the respective display electrodes 15. Adjacent ones of the common electrode sections 17a are interconnected by connecting sections 17 i b. In this example, the connecting section 17b is a narrow strip connecting the centers of the opposed sides of adjacent common electrode sections 17a. Thus, the gate and source bus lines 18 and 19 do not face the common electrode 17 except for the narrow connecting sections 17b.

Figure 8:
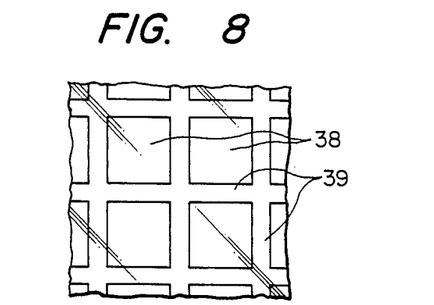
FIG. 8 is a plan view showing a black filter and color filters in the device shown in FIG. 6.

This example of liquid-crystal display device is for color display and has color filters 38 formed on the respective common electrode sections 17a, as shown in FIG. 6. The color filters 38 may consists of three different color filters which are uniformly distributed over the substrate 12. As shown in FIG. 8, a black filter 39 is formed between adjacent color filters 38, i.e., between adjacent common electrode sections 17a. An orientation layer 41 is formed on the color filters 38 and black filter 39 such that it is in contact with the liquid crystal 14.

In the display device shown in FIG. 6, the liquid crystal 14 is of guest-host type and contains liquid crystal molecules 14a and dichroic dye molecules 14b. More specifically, when a voltage is applied between a display electrode 15 and common electrode 17, the liquid crystal molecules 14a and black dye molecules 14b in the pertinent portion of the liquid crystal 14 are oriented such that their long axes are perpendicular to the display electrodes 15 as shown in the left half of FIG. 6. Thus, this portion of the liquid-crystal display device transmits therethrough light and is seen to be of the color of the associated color filter 38. On the other hand, in the absence of voltage across the display electrode 15 and common electrode 17, the liquid crystal molecules 14a and black dye molecules 14b are oriented such that their axes are parallel to the display electrode 15 and also parallel to the polarizing plate 42 as shown in the right half of FIG. 6. Thus, light transmitted through the polarizing plate 42 and incident on the display device is absorbed by the black dye molecules 14b in this portion, so that this portion is seen to be black, that is, no color display is provided by this portion.

Figure 9:
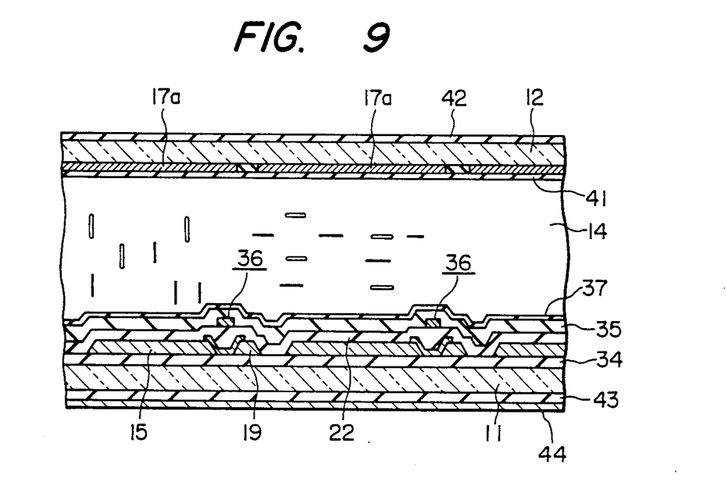
FIG. 9 is a sectional view showing a different embodiment of the invention applied to a liquid-crystal display device using a twisted nematic liquid crystal.

FIG. 9 shows a liquid-crystal display device, which uses a twisted nematic liquid crystal for reflection type display. In the Figure, parts like those in FIG. 6 are designated by like reference numerals. In this instance, a polarizing plate 42 and a polarizing plate 43 having a perpendicular polarizing direction are provided on the outer surfaces of the substrates 12 and 11, respectively. Further, a reflecting plate 44 is provided on the outer side of the polarizing plate 43. When a voltage is applied between a display electrode 15 and common electrode 17, the liquid crystal molecules 14a in the pertinent portion of the liquid crystal are oriented such that their axis is perpendicular to the display electrode 15 as shown in the left half of FIG. 9. In this state, since the polarizing direction is not rotated by the liquid crystal of perpendicular orientation, light transmitted through the polarizing plate 42 is blocked by the polarizing plate 43, so that it does not reach and is not reflected by the reflecting plate 44. Thus, no display is provided. In the absence of voltage between the display electrode 15 and common electrode 17, the long axes of liquid crystal molecules 14a are gradually turned as shown in the right half of FIG. 9. Thus, the polarizing direction of incident light is turned through 90° by the liquid crystal molecules, so that the light is transmitted through the polarizing plate 43 to be reflected by the reflecting plate 44 to be directed from the liquid-crystal display device toward the light incidence side. In this way, a display is provided. In the thin-film transistor 36 of this case, the light-blocking layer 33 with respect to the semiconductor layer 22 is omitted.

Figure 10:
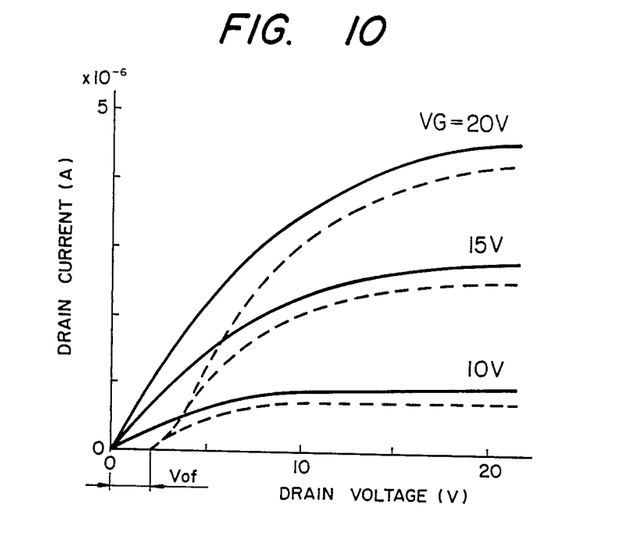
FIG. 10 is a graph showing drain current versus drain voltage characteristics of a thin-film transistor.

As has been described in the foregoing, with the liquid-crystal display device according to the invention the opposed sides of the drain and source electrodes 15a and 19a of thin-film transistor are constituted by the tapered surfaces 31 and 32. Thus, a large contact area and satisfactory contact with the semiconductor layer 22 can be obtained. Owing to the presence of the ohmic contact layers 25, 26, there is no off-set in the drain current versus drain voltage, and the drain voltage rises from zero, as shown in by solid curves in FIG. 10. In the graph, the gate voltage VG is taken as the third parameter. In the prior art case, however, there is an off-set $V_{of}$ as shown by dashed curves, and the drain current is not caused unless the drain voltage is increased to exceed the off-set voltage $V_{of}$. Therefore, the prior art liquid-crystal display device has a narrow gradation range for gradation display. In contrast, according to the invention a satisfactory gradation display can be obtained because of the freedom from the off-set. In addition, the drain current itself is higher than that in the prior art as shown in FIG. 10. Thus, current can be supplied to the display electrode at a high speed, so that it is possible to obtain a high speed operation.

Figure 11:
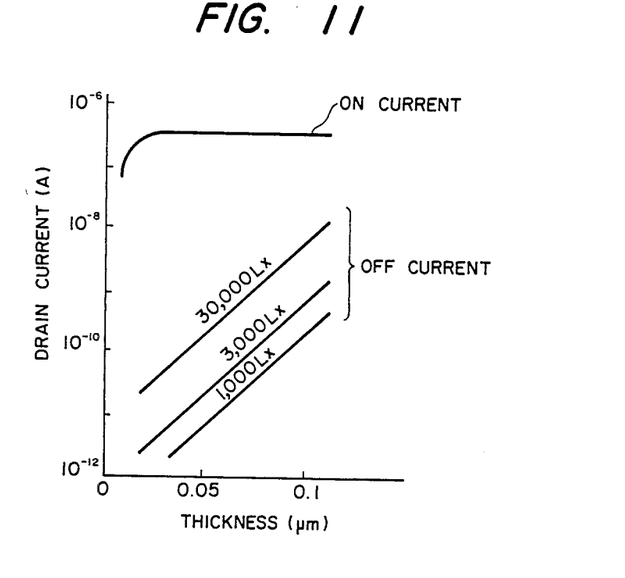
FIG. 11 is a graph showing characteristics of drain current versus semiconductor layer thickness of a thin-film transistor.

Further, since the semiconductor layer 21 of each thin-film transistor overlies the tapered side surfaces of the electrodes 15a and 19a, its thickness can be reduced to be less than 500 angstroms. Further, the thin semiconductor layer 21 has a high resistance, so that the drain current in the thin-film transistor in the "off" state thereof can be made low even when there is externally incident light. More specifically, when amorphous silicon is used as the semiconductor layer 21, the greater the thickness the higher is the "off" current in the thin-film transistor as shown in FIG. 11. According to the invention the thickness of the semiconductor layer 21 can be made less than 0.05 μm (i.e. 500 Å), whereas in the prior art it can not be made less than 0.1 μm. According to the invention, therefore, the "off" current can be reduced by more than one digit place when compared to the prior art. FIG. 11 shows "off" current characteristics in the case when the gate voltage is 0 V and the drain voltage is 5 V, with illumination intensity of external light being taken as a third parameter. The "on" current in the thin-film transistor is fixed irrespective of the thickness of the semiconductor layer 21. The "on" current characteristic is in the case when the gate voltage is 10 V and drain voltage is 5 V.

Figure 12:
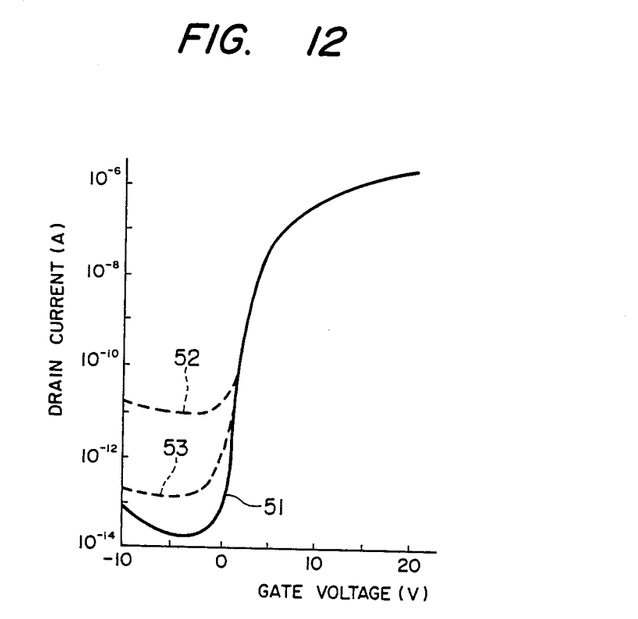
FIG. 12 is a graph showing drain current versus gate voltage characteristics of a thin-film transistor.

FIG. 12 shows drain voltage versus gate voltage characteristics. As is shown, when the gate voltage is below 0 V, the drain current is extremely low in the absence of external light as shown by a solid line 51. A high "on"-to- "off" ratio thus can be obtained. Where the external light illumination intensity is 10,000 Lx and the light-blocking layer 33 is not provided, the necessary "on"-to- "off" ratio can be obtained by reducing the thickness of the semiconductor layer 21 (to 0.03 μm in this example) as shown by dashed curve 52. Where there is external light of 100,000 Lx, an "on"-to-"off" characteristic as shown by dashed curve 53 can be obtained by the provision of the light-blocking layer 33. In the case of FIG. 12, the drain voltage is 10 V, and the channel of the semiconductor layer 21 has a length of 10 μm and a width of 100 μm.

As has been shown, according to the invention the opposed sides of the drain and source electrodes of thin-film transistor are constituted by tapered surfaces 31, 32 so that the thickness of the semiconductor layer 21 of the thin-film transistor can be sufficiently reduced without being dissected at the edges of the drain and source electrodes. In other words, the thickness of the source bus line can be increased to reduce the resistance thereof. A display of uniform brightness can be obtained even over a large display area. Further, since the common electrode 15 does not face the source or gate bus line 19 or 18 except for the connecting sections 17b, the electrostatic capacitance between the bus line and common electrode can be reduced, so that it is possible to increase the speed of operation. Further, it is possible to prevent application of DC voltage across the liquid crystal between the common electrode and source or gate bus line, and the deterioration of the liquid crystal can be reduced. Further, a high contrast can be achieved when an array of the common electrode section according to the invention is employed in a liquid crystal display of the type in which pixels applied with a voltage are shown bright. Further, a high contrast can be obtained by providing the black filter 39 in a liquid-crystal display device of the light transmission type.

As explained before, the ohmic contact layers 25 and 26 are formed on the tapered surfaces 31 and 32 of the display electrodes 15 and source bus lines 19. The ohmic contact layers may be of n+ type silicon containing phosphorus, for instance. In this case, the display electrodes 15 and source bus lines 19 of phosphorus containing ITO are first formed and then the semiconductor layers 21 are formed through, for instance, the plasma assisted CVD process. When forming the semiconductor layers 21 by the plasma assisted CVD process, phosphorus in the transparent electrodes 15a and 19a is diffused into the semiconductor layer 21, whereby the ohmic contact layers 25 and 26 can be obtained automatically. These ohmic contact layers 25 and 26, although they are thin, are reliably formed on the entire contact surface of the electrodes 15a and 19a, so that satisfactory ohmic contact can be obtained. Also in this case, phosphorus may be coupled to the elements in the transparent electrodes, e.g., indium and tin, to prevent the elements from diffusing into the semiconductor layer 21, thus, preventing deterioration of operation characteristics of the thin film transistor.

What is claimed is:

1. A liquid-crystal display device comprising:
    a liquid-crystal cell including first and second substrates opposing each other and a liquid crystal sealed therebetween;
    a plurality of transparent display electrodes formed on the inner surface of said first transparent substrate;
    a plurality of thin-film transistors formed on said first transparent substrate and each having a drain electrode connected to one of said display electrodes;
    transparent source bus lines formed on said first transparent substrate and each connected to transparent source electrodes of a certain number of said thin-film transistors, each said source bus line being formed integrally with the source electrode to which it is connected;
    gate bus lines formed on said first transparent substrate and each connected to the gate electrodes of a certain number of said thin-film transistors; and
    a transparent common electrode formed on the inner surface of said second transparent substrate;
    the source and drain electrodes of each thin-film transistor having opposed sides constituted by tapered surfaces with the distance between said surfaces being progressively decreased as said tapered surfaces appproach said first transparent substrate;
    ohmic contact layers formed over the entirety of said tapered surfaces; and
    a semiconductor layer in each said thin-film transistor formed over said source and drain electrodes via said ohmic contact layers and extending between said source and drain electrodes.

2. The liquid-crystal display device according to claim 1 wherein said display electrodes are formed in a matrix arrangement with rows and columns, one of said gate bus lines being provided for each of said rows, one of said source bus lines being provided for each of said columns, and said thin-film transistors being provided at the intersections of said gate and source bus lines.

3. The liquid-crystal display device according to claim 2, wherein said common electrode consists of common electrode sections having substantially the same size and shape as and facing said respective display electrodes, adjacent ones of said common electrode sections being connected together by a connecting section.

4. The liquid-crystal display device according to one of claims 1 to 3, wherein said semiconductor layer consists of amorphous silicon and has a thickness of 500 angstroms or below.

5. The liquid-crystal display device according to claim 4, wherein said semiconductor layer has a thickness of approximately 100 angstroms.

6. The liquid-crystal display device according to one of claims 1 to 3, wherein the inclination angle of said tapered surfaces with respect to said first transparent substrate is substantially 45°.

7. The liquid-crystal display device according to one of claims 1 to 3, wherein said ohmic contact layers are $n^+$-type semiconductor layers.

8. The liquid-crystal display device according to one of claims 1 to 3, wherein said ohmic contact layers are formed as a result of diffusion of an element in said source and drain electrodes into said semiconductor layer.

9. The liquid-crystal display device according to one of claims 1 to 3, wherein a light-blocking layer is formed on said first transparent substrate such as to face said semiconductor layer.

10. The liquid-crystal display device according to claim 2, which further comprises color filters formed on said second transparent substrate such as to face said respective display electrodes, said color filters consisting of three different color filters distributed substantially uniformly.

11. The liquid-crystal display device according to claim 10, which further comprises a black filter formed to fill the gap between adjacent ones of said color filters.

* * * * *